United States Patent [19]

Simpson

[11] Patent Number: 4,595,836
[45] Date of Patent: Jun. 17, 1986

[54] ALIGNMENT CORRECTION TECHNIQUE

[75] Inventor: Robert A. Simpson, Wappingers Falls, N.Y.

[73] Assignee: International Business Machines Corporation, Armonk, N.Y.

[21] Appl. No.: 626,368

[22] Filed: Jun. 29, 1984

[51] Int. Cl.$^4$ .......................................... G01N 23/00
[52] U.S. Cl. ................................................. 250/491.1
[58] Field of Search ................. 250/491.1, 492.2, 398, 250/492.3, 310, 492.21

[56] References Cited

U.S. PATENT DOCUMENTS

| | | | |
|---|---|---|---|
| 3,519,788 | 7/1970 | Hatzakis | 250/492.2 |
| 3,811,069 | 5/1974 | O'Keeffe | 250/491.1 |
| 3,919,550 | 11/1975 | Banbury | 250/311 |
| 3,937,959 | 2/1976 | Namae | 250/311 |
| 4,357,540 | 11/1982 | Benjamin et al. | 250/491.1 |
| 4,365,163 | 12/1982 | Davis et al. | 250/491.1 |

Primary Examiner—Bruce C. Anderson
Assistant Examiner—Paul A. Guss
Attorney, Agent, or Firm—Sughrue, Mion, Zinn, Macpeak, and Seas

[57] ABSTRACT

An E-beam alignment correction system employing an up-up integration technique. Input signals during each scan period are integrated and digitized then held in respective registers. The value in one register is converted to its negative value then digitally combined with the other value to generate an alignment correction value. This technique eliminates the requirement of positive and negative integrations needed with up-down integration techniques and droop of the sample and hold device as a function of time. A common analog path is used so that errors add out during digital combination of signal values.

7 Claims, 6 Drawing Figures

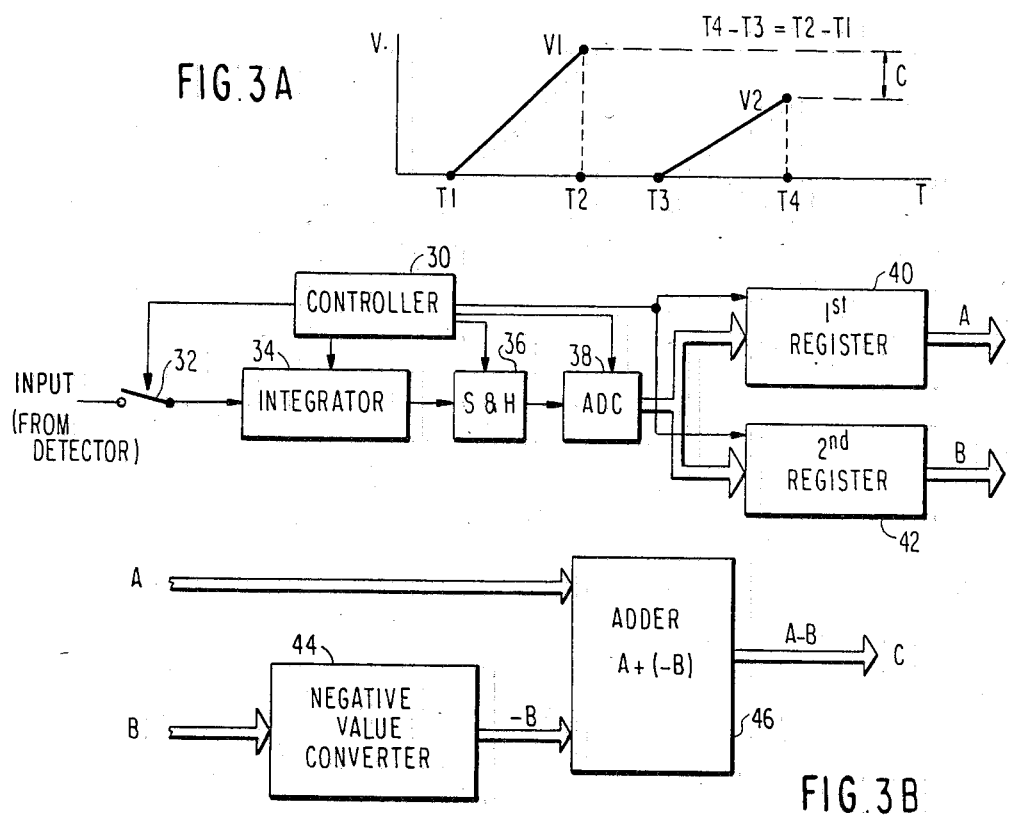

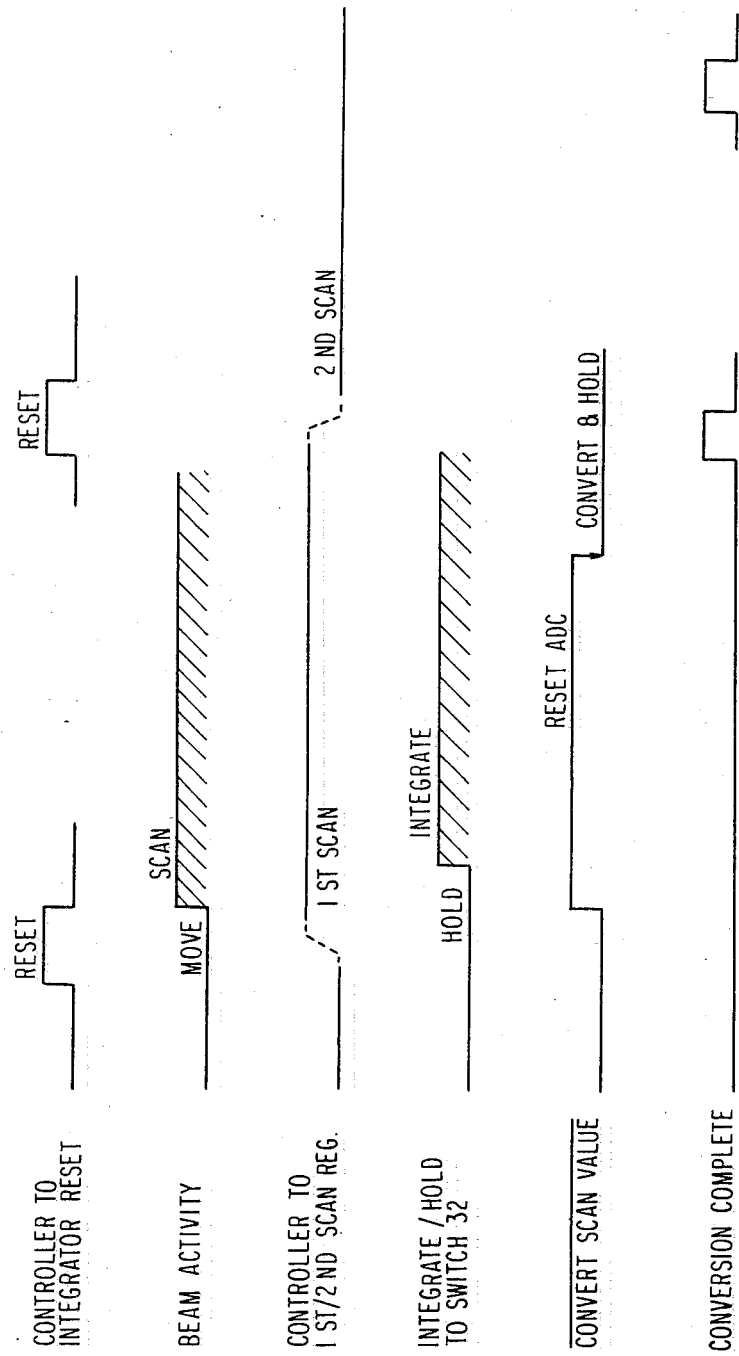

ALIGNMENT CORRECTION TECHNIQUE

BACKGROUND OF THE INVENTION

This invention relates to an automatic alignment correction technique and in particular, a technique for automatic beam alignment used in measuring, testing and verfying high contrast image patterns.

There exists in many systems a requirement for actual comparison of the average values of two or more signal levels. A typical example is in the field of electron beam (E-beam) mask inspection systems wherein alignment is obtained by scanning a pair of windows that straddle opposite edges of a feature to be inspected. By comparing back-scatter radiation detected during scanning of those windows, a position error signal is generated and alignment is ultimately obtained.

Reference is made to U.S. patent application Ser. No. 509,515, filed June 30, 1983 now U.S. Pat. No. 4,546,260 and entitled "Alignment Technique" wherein such a system is disclosed and relevant prior art is discussed. Other relevant prior art is found in U.S. Pat. Nos. 4,357,540 and 4,365,163. A common aspect of this prior art is the use of scanning windows which straddle opposite edges of a feature in an area to be inspected. Such are shown in FIG. 1 herein where two scanned windows are shown on opposite edges of a registration feature. In the case of the U.S. Pat. Nos. 4,365,163 and 4,357,540 an up-down integration alignment technique is employed. Such is shown in FIG. 2A. A proportioning circuit, shown in FIG. 2B, generates an alignment correction signal which is proportional to the inspection beam to inspected feature alignment error. While scanning the window straddling one side of a registration feature, the alignment circuit of FIG. 2B operates so that the input signal from a detector is integrated during the period $T_1$ to $T_2$ shown in FIG. 2A. While the window straddling the opposite side of the registration feature is scanned, the detector signal is inverted using the inverter 20 before being input to the integrator 22. These two components form a proportioning circuit.

The proportioning circuit thus integrates the signal obtained while scanning the first scanned window and modifies it by that obtained while scanning the second, during that is, the period $T_3$ to $T_4$, shown in FIG. 2A. The resulting correction signal C is then a measure of the magnitude and the direction of the overlay difference between the scanning beam and the target to be inspected.

As will be appreciated, the integration occuring during the first scan period $T_1$ to $T_2$ is modified by the integration occuring during the period $T_3$ to $T_4$. The resulting difference signal as processed in FIG. 2 constitutes the correction signal C which is held by the sample and hold circuit 24 during the time it must be used.

This technique employing an up-down integration technique to form the difference signal and the subsequent use of sample and hold has several disadvantages. The first is that the up and down ramps which are generated result from signal paths that involve a large number of different and variable components. Positive (up) and negative (down) integration is involved. This introduces an error in the resulting alignment correction signal that is a result of tolerances and the switching of components in the different signal paths.

Another difficulty is that the hold time of the sample and hold circuitry is not fixed but varies indefinitely with the number of inspection scans to be performed between updates. It will be appreciated that a sample and hold configuration is a compromise between the need to minimize droop for the longest probable hold time and the need for high speed operation. If the design criteria are such that reduction in droop for long periods is of paramount importance, then a large capacitance value must be used. This, in turn, increases the settling time of the sample and hold. Consequently, a design trade-off exists which places an upper bound on the time between updates.

Reference is also made to U.S. Pat. No. 3,811,069 which discloses an E-beam alignment technique that compares relative amplitudes of at least two frequency modulated signals. U.S. Pat. No. 3,919,550 relates to another analog technique for improving E-beam stability by providing focused and defocused signals, employing sample and hold techniques and feeding the sample and hold outputs to a differential amplifier. U.S. Pat. No. 3,937,959 relates to an E-beam autofocus circuit which generates DC voltages from two horizontal E-beam scans. These voltages are stored in analog memory circuits which are subsequently compared.

Thus, within the prior art, the use of analog circuitry is uniform and this introduces errors which in turn deteriorate the overall accuracy of the ultimate comparison required of such systems. Such is especially important in the context of E-beam alignment systems that require high degrees of accuracy.

SUMMARY OF INVENTION

Given the deficiencies in the prior art, it is an object of the present invention to define a technique for accurate comparison of average values of two or more analog signals.

Another object of the present invention is to define a registration system for use in E-beam systems which eliminates inverter related errors inherent in analog systems. Thus, by the present invention the need for an inverter is eliminated and therefore the output errors due to inverter gain, offset, drift and switching.

Still another object of the present invention is to improve repeatability of the comparison technique by minimizing the number of analog components whose operation is inherently affected by tolerances, time, and environmental considerations.

In accordance with the present invention, the use of up-down integration is eliminated. This invention employs an up-up integration technique to generate the alignment correction signal. A common analog path is used, so this invention eliminates most of the error components of the remaining analog circuitry, and digitization provides a correction signal which is stable indefinitely.

The present invention employs an analog to digital converter to digitize the integrated signal generated during scanning of the window straddling one side of the registration feature. This digital signal is stored in a first register. The integrated signal generated while scanning the window straddling the opposite side of the registration feature is digitized and saved in a second register. This second value is converted to its negative equivalent and then added to the first value to determine the alignment correction value.

This invention will be described in greater detail by referring to the attached drawings and description of the preferred embodiment which follows.

BRIEF DESCRIPTION OF THE DRAWINGS

FIG. 1 is a schematic representation showing the registration feature scan windows relative to a particular registration feature;

FIG. 2A is a plot of the integrator output voltage as a function of time showning alignment correction signal generation as utilized in prior art systems;

FIG. 2B is a circuit diagram of an alignment correction generator as utilized in prior art systems;

FIG. 3A is a graph of the integrator output voltage as a function of time describing the improved alignment correction signal generation technique in accordance with the present invention; and FIG. 3B is a circuit diagram showing the improved alignment correction generator in accordance with the present invention; and FIG. 4 is a timing chart for explaining functioning of this invention.

DESCRIPTION OF THE PREFERRED EMBODIMENT

In co-pending application Ser. No. 509,515, filed June 30, 1983 (incorporated herein by reference) as illustrated therein, is the signal from a Backscattered Electron Detector is input to the Correction Increment Generator, which integrates the signal during each of the pair of scans, digitizes the resulting values, and outputs their difference as the position correction increment. This value is input to a Correction Generator which adds the increment to the existing position correction value, to generate the updated position correction value which is output to the Beam Position Correction Driver. A Beam Position Correction Driver converts the position correction value to an analog correction signal which is sent to the Beam Position Driver, to reposition the beam.

In this invention the Backscattered Electron Detector signal is input to the integrator, whose operation is controlled by the reset and integrate/hold lines from the digital controller. The reset line is used to zero the integrator. The integrate/hold line enables integration when a feature edge is being scanned or causes the integrated signal to be held until after the sample and hold (S & H) module is set to hold. Upon completion of a scan, the system controller uses the convert scan value signal line to set the S & H to hold mode and, after a short delay, to signal the analog to digital converter (ADC) to convert the analog input level to an equivalent digital value. When the ADC completes the conversion, it outputs the digital value and conversion complete signal. The delayed conversion complete signal is used with the 1st/2nd scan control signal to strobe the digitized value into the first or second scan register. For example, the value generated from the first scanning region is strobed into the 1st scan register and that generated from the second scanning region is strobed into the 2nd scan register. Generating the difference (A−B) between these two values, requires conversion of the +B value in the 2nd scan register to its negative (−B). The value from the 1st scan register (A) and the negative of the value in the 2nd scan register (−B) are fed continuously into an adder that generates the sum A+(−B), which equals A−B, the position correction increment. This value has a sign that indicates the direction of and a magnitude that indicates the amount of the translation between the beam and the scanned feature. This value is the next correction increment input to the Correction Generator.

Referring now to FIGS. 3 and 4, the invention will be described in the context of an alignment technique utilized for generating correction signals in E-beam systems. As shown in FIG. 3A, this invention utilizes an up-up integration alignment technique to generate alignment correction signals. Two equal but distinct and independent scan periods are utilized, $T_1$ to $T_2$ and $T_3$ to $T_4$. As indicated in FIG. 3A, the integration time, $T_4$ to $T_3 = T_2$ to $T_1$. The error correction signal is shown as the voltage difference C in FIG. 3A. Thus two independent "up" ramps are generated from the backscattered electron detector output voltage signals generated during scanning of the windows on opposite sides of the registration feature.

Referring to FIG. 3B, the backscattered electron detector output is gated by means of a controller 30 which controls switch 32 to gate the signal into the integrator 34. The integrated value is held by a sample and hold register 36 immediately after the time interval $T_1$ to $T_2$ in the case of scanning the first window or the time interval $T_3$ to $T_4$ in the case of scanning the second window. The controller 30 is employed to time sequence operation of the integrator 34 and sample and hold circuit 36. The analog to digital converter 38 is employed to digitize the integrated signal generated during scanning of the window straddling one side of the registration feature.

Thus, referring to FIGS. 1 and 3A, during the period of time $T_1$ to $T_2$ scanning of the first scan window occurs and the backscattered electron detector output signal is integrated. The integrator output signal level is then held and converted to a digital value which is stored in register 40. This value is denoted in FIG. 3B as digital output A. The backscattered electron detector signal is integrated while scanning the window straddling the opposite side, or in the case of FIG. 1 the second scan window, occurs during time period $T_3$ to $T_4$. In a comparable manner, the integrator output signal level is than held by the sample and hold circuit 36 and digitized by the ADC 38. The digitized value is stored in a second register 42. The digitized value is denoted in FIG. 3B as B. The timing is illustrated in FIG. 4.

Digital value B is then converted to its negative value (−B) by negative value converting 44. The resulting two values A and −B are then input to an adder 46 to form a the difference value (A−B) which is the alignment correction value C.

The use of the circuitry shown in FIG. 3B eliminates errors which are related to the inverter associated with prior analog systems. The inverter of the prior art system is eliminated and consequently the switching associated with its use and therefore output errors due to inverter gain, offset drift and switching are also eliminated.

This invention employs a common analog path for signals prior to digitization. This eliminates offset, switching and drift errors. Since these errors are common to both integrated signals they add out when the difference between the digitized values is generated.

A minimum number of analog components are employed and therefore those components which are affected by manufacturing tolerances and environmental considerations are correspondingly minimized. Additionally, with the use of fewer analog components, the design is simplified. Noteworthy is that the hold time for the sample and hold circuit 36 is short and fixed. This is in contrast to that utilized in the prior art. Thus, it must be droop free only during ADC operation. It need not be droop free indefinitely as in the case of prior art analog systems. Moreover, since the sample and hold output signal from circuit 36 need be droop free only during ADC conversion, it allows smaller capacitors to be employed. Faster operation occurs because settling time is improved.

Thus as pointed out herein, an advantage of this invention is that both ramps are generated using exactly the same analog signal path, that is, integrator, sample and hold, and analog to digital convertor. This results in nearly all errors adding out when the difference is generated digitally.

It will be apparent to those of working skill that modifications of this invention may be freely practiced without departing from the essential scope of the invention.

I claim:

1. A beam alignment system for comparing first and second input analog voltage signals and generating a correction value comprising:
    an integrator;
    an A/D converter connected to said integrator; first and second registers;
    a digital comparator; and,
    a controller for operating said integrator and connecting said A/D converter to said first register to thereby store a digital representation of said first voltage in said first register, and for subsequently connecting said A/D converter to said second register to thereby store a digital representation of said second voltage in said second register, said controller subsequently connecting said first and second registers to said digital comparator to thereby combine the digital representations of said first and second analog voltages and produce a correction signal wherein signal path error are eliminated.

2. The system of claim 1 wherein said first and second input analog voltages are signals from a backscattered electron detector generated during scanning of first and second scanning windows which straddle opposite edges of a registration feature and wherein said correction signal is an alignment correction signal.

3. The system of claim 1, further comprising means to convert the digital representation stored in one of said registers to a negative value prior to input to said comparator.

4. The system of claim 3, wherein said comparator comprises an adder and wherein said correction signal is a digital sum of the digital representation stored in one register and the negative value of the digital representation stored in the other register.

5. The system of claim 1 wherein said first and second integrator output voltages each comprise discrete ascending analog voltages generated during two equal time intervals wherein the difference in peak voltages at the end of each time interval is representative of said correction signal.

6. A method of comparing the average values of first and second input analog voltages in a beam alignment system, comprising the steps of:
    integrating said first analog input voltage signal over a first predetermined time period where said first integrated analog voltage signal increases in value;
    digitizing the integrated value of said first integrated analog voltage at the end of said first predetermined time period;
    storing the digitized value of said first integrated analog voltage in a first register;
    integrating said second input analog voltage signal over a second predetermined time period where said second integrated analog voltage signal increases in value;
    digitizing the integrated value of said second integrated analog voltage at the end of said second predetermined time period;
    storing the digitized value of said second integrated analog voltage in a second register; and
    subtracting the contents of said second register from the contents of said first register to generate a correction signal.

7. The method of claim 1 wherein said first predetermined time period equals said second predetermined time period.

* * * * *